United States Patent [19]
Ohnishi et al.

[11] Patent Number: 5,120,925
[45] Date of Patent: Jun. 9, 1992

[54] METHODS FOR DEVICE TRANSPLANTATION

[75] Inventors: Tsuyoshi Ohnishi, Kokubunji; Yoshimi Kawanami, Fuchu; Yuuichi Madokoro; Kaoru Umemura, both of Kokubunji; Tohru Ishitani, Sayama, all of Japan

[73] Assignee: Hitachi, Ltd., Tokyo, Japan

[21] Appl. No.: 519,402

[22] Filed: May 4, 1990

[30] Foreign Application Priority Data

May 10, 1989 [JP] Japan .................................. 1-114941

[51] Int. Cl.⁵ ............................................. B23K 15/00
[52] U.S. Cl. ............................. 219/121.12; 219/121.15
[58] Field of Search ...................... 219/121.12, 121.13, 219/121.14, 121.15, 121.31, 121.32, 121.28, 121.29, 121.63, 121.64, 121.83

[56] References Cited

FOREIGN PATENT DOCUMENTS 63-25660 5/1988 Japan .

*Primary Examiner*—C. L. Albritton
*Attorney, Agent, or Firm*—Fay, Sharpe, Beall, Fagan, Minnich & McKee

[57] ABSTRACT

A method for device transplantation includes the conveyance of a microminiature device, which has been premanufactured, to a desired place located on a sample, observation and fabrication of the new device with a focused beam, and repair of passive elements or active elements located on the sample. Additionally, the new microminiature devices may be transplanted based on the observed results.

25 Claims, 13 Drawing Sheets

10µ

10µ

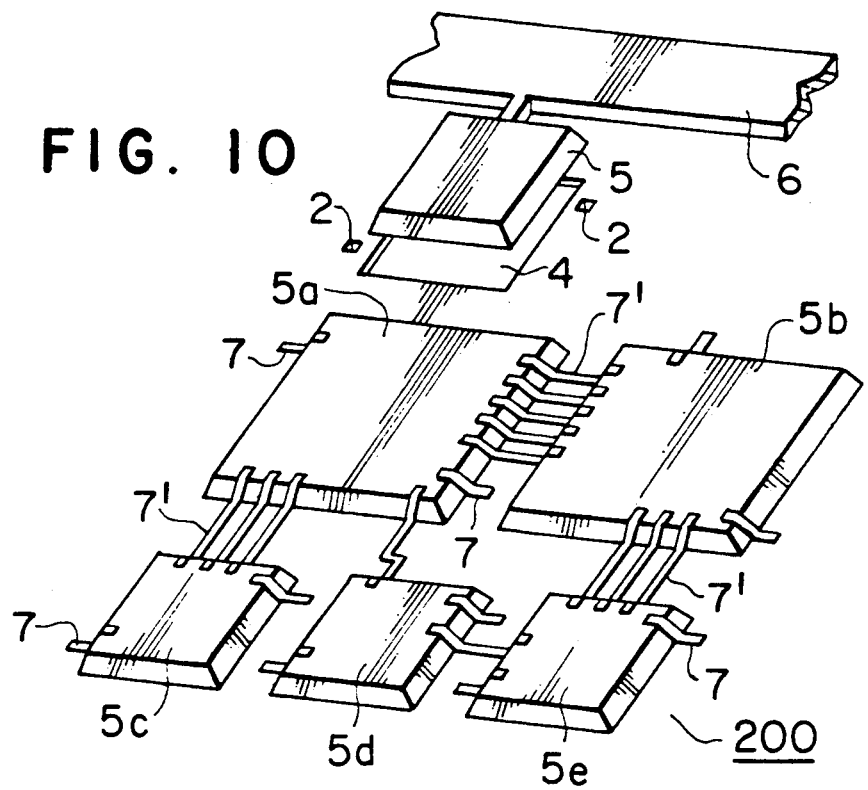
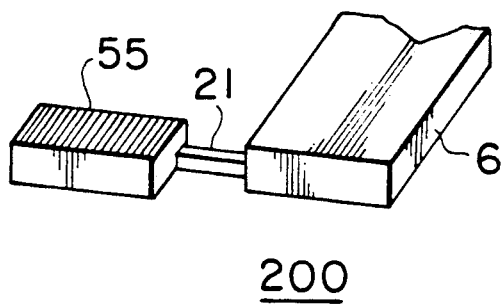
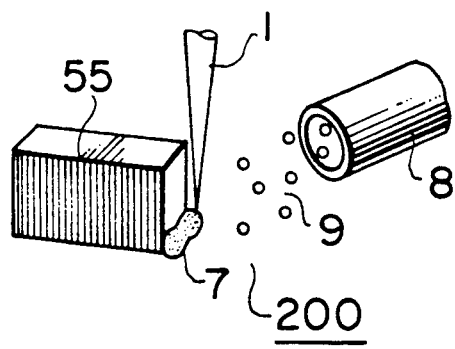
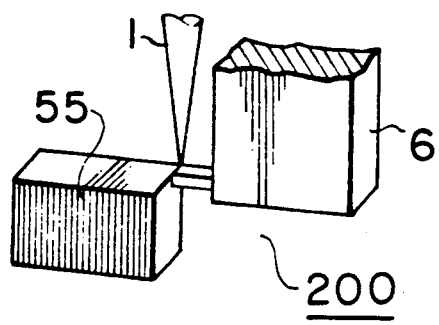

METHODS FOR DEVICE TRANSPLANTATION

BACKGROUND OF THE INVENTION

The present invention relates to methods for transplanting devices with a focused beam. More particularly, the invention relates to methods for device transplantation which are capable of repairing and exchanging parts (micro device parts) used in general micro device products such as micro electronic products like large scale integrated circuits, micro optical products, and micro mechanical products.

An example of the prior art has been described in Jp-B-63-25660 (25660-1988). FIG. 3 is a schematic block diagram showing this prior art device. As shown, a gallium liquid metal ion source 100 serves to bombard a sample 200 with an ion beam. The traveling ion beam is deflected by a voltage applied to an electrostatic deflector 105, passes through an objective lens 106, and then is focused on the sample 200. The detector 107 serves to detect, as an intensity signal, secondary electrons ejected from the sample 200 in synchronism with the beam scanning. The intensity signal displayed on a CRT display 400 results in producing an image formed by a scanning ion microscope (hereinafter, abbreviated as a SIM). This image indicates the microminiature structure of the sample 200 at a resolution of about a beam diameter.

When an ion beam bombards the sample, a sputtering phenomenon is brought about, thereby allowing the sample to be etched. And, when the ion beam bombards the sample in a metal-containing gas atmosphere, the metal contained in the gas is deposited on the sample surface for forming a conductive film.

This prior art device is designed to employ those techniques in combination for repairing a wire pattern contained on an integrated circuit. FIG. 4 shows a wiring pattern 10 with a trimming area 30. The ion beam locally bombards the wiring pattern for forming the trimming area 30, thereby electrically disconnecting the pattern. For positioning where the ion beam is bombarded, the SIM image can be used.

FIG. 5 shows a conductive film 7 formed when the ion beam locally bombards in the gas-containing atmosphere according to the prior art. The conductive film 7 serves to electrically connect desired portions of the pattern 10.

The foregoing prior art device makes it possible to trim wiring patterns, which have become unnecessary, and to connect parts, which have become newly necessary, with wiring patterns at a microminiature level, that is, a beam diameter level, thereby being able to exchange and repair the wiring patterns. The newly-formed wiring conductive film, however, has such high resistance that the wiring function cannot be satisfactorily operated. Further, the prior art device does not actually prepare for repairing passive elements and active elements except for the conductive films.

SUMMARY OF THE INVENTION

It is therefore an object of the invention to provide a device transplantation method which consists of a conveyance process of conveying a new, premanufactured, micro device part onto a desired place located on a sample, and a fabrication process of electrically or mechanically connecting the micro device part to the sample with an observing and fabricating means for these sample and micro device parts, said means being essentially a focused beam.

As mentioned above, the present invention provides for repairing failed or aged parts included in the micro device product, or for transplanting (supplementing or exchanging) new parts. It thus allows for repairing and exchanging any part whether it is a passive element or an active one, and for maintaining the micro device product at a microminiature level. The invention also has a function of making sure that the product has been duly repaired, and of repairing it again if it has not, thereby offering a far higher economical performance in comparison to the prior art in serving to replace an overall product with a new one.

Further, while it has been conventionally difficult to fabricate a compound device in one process, the invention makes possible the fabrication of a compound device containing several elements such as a bipolar element, a metal oxide semiconductor, a microcomputer, and a dynamic random access memory (DRAM) element in one process. And, it is capable of manufacturing, as a compound element, an element consisting of materials subject to respective heat treatments such as a high melting point material, a low melting point material, and a superconductive material. The manufacture of such an element has been conventionally difficult. Moreover, it is expected that the invention enables a driving circuit of an integrated display device to be integrally fabricated around the display.

BRIEF DESCRIPTION OF THE DRAWINGS

FIG. 10 is a perspective view showing a hybrid integrated circuit according to an embodiment of the invention;

FIGS. 11A to 11C are perspective views showing an embodiment in which a device is transplanted in the vertical direction of the substrate;

DESCRIPTION OF THE PREFERRED EMBODIMENTS

Hereinafter, a description will be directed to several embodiments of the invention.

Figure 2:
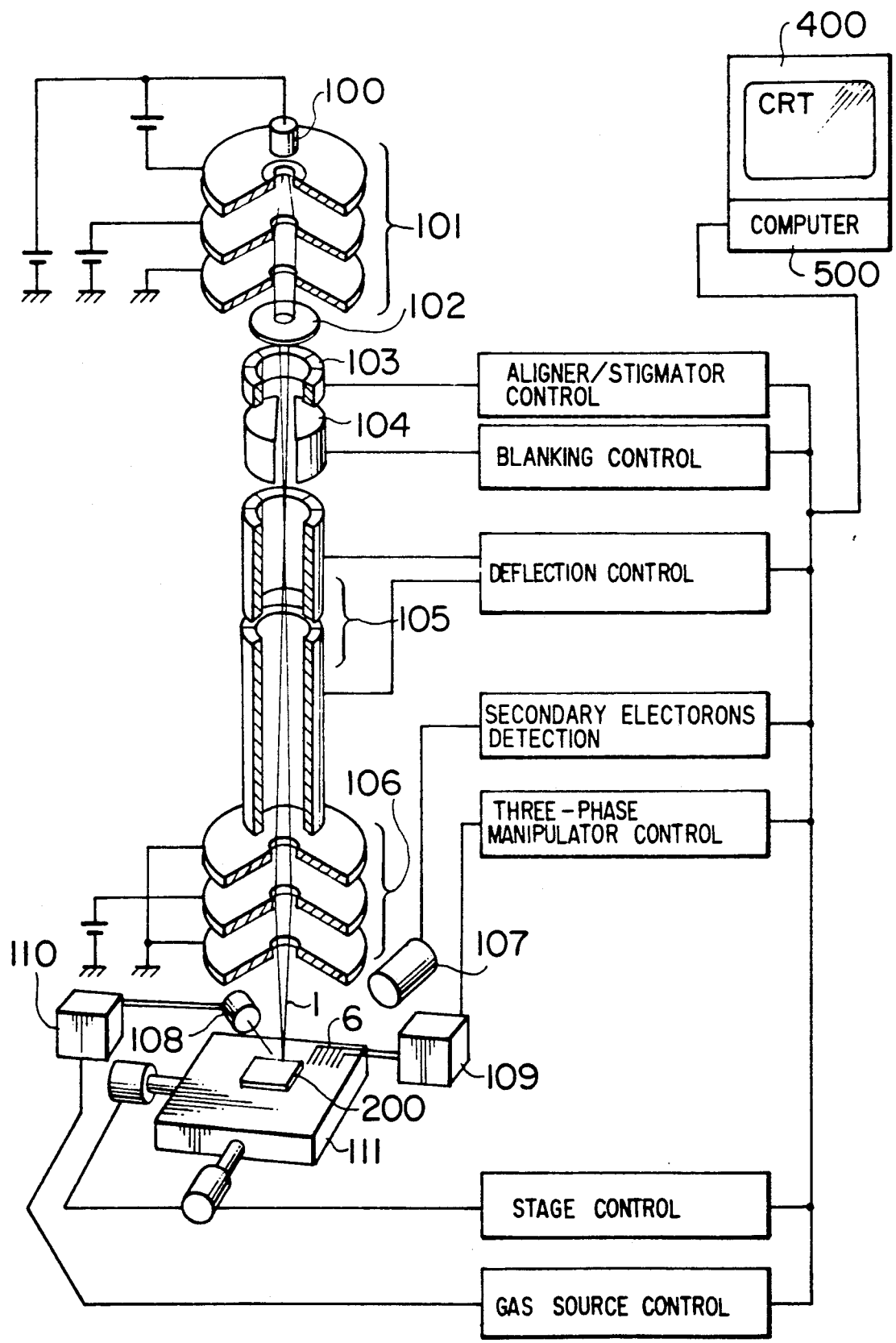
FIG. 2 is a schematic block diagram showing a focused ion beam system used in an embodiment of the invention.
Figure 3:
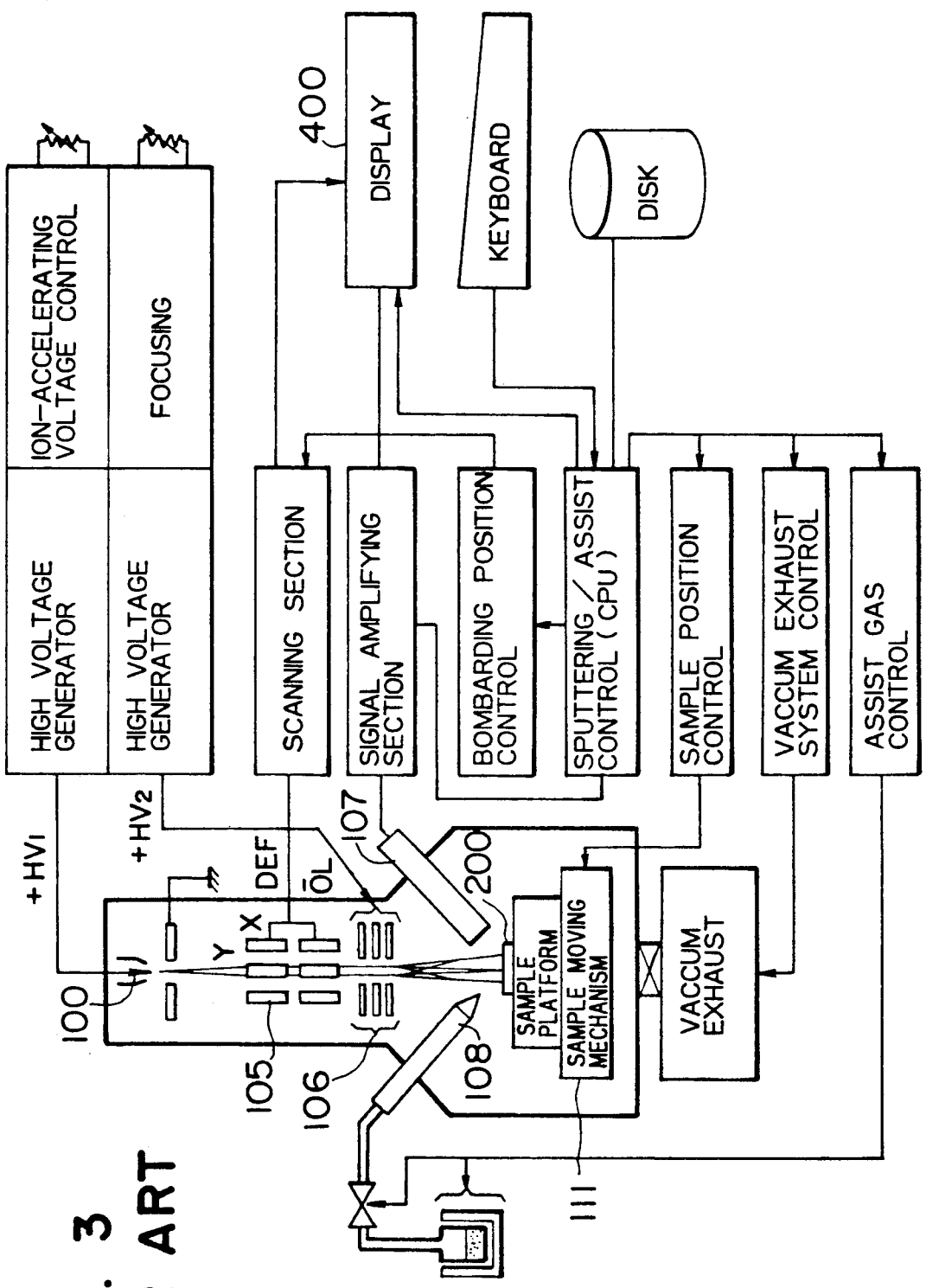
FIG. 3 is a block diagram showing the arrangement of a conventional pattern-modifying device.
Figure 4:
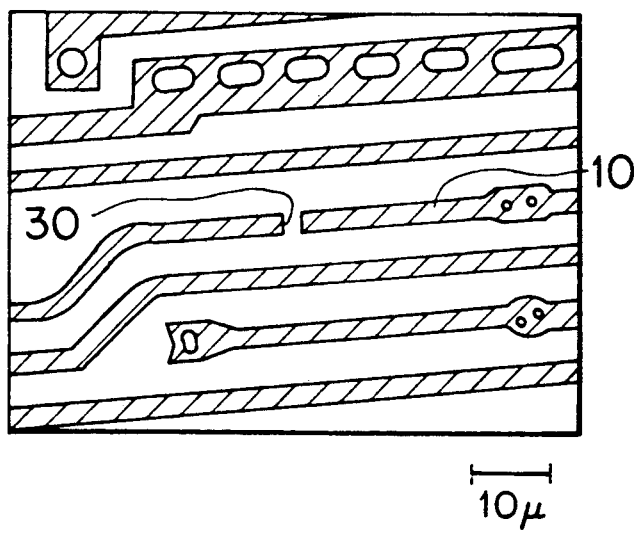
FIG. 4 is a view illustrating how a pattern is disconnected in the prior art.
Figure 5:
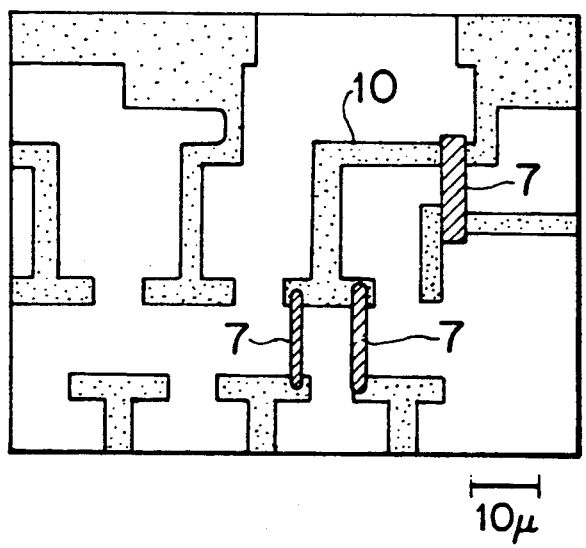
FIG. 5 is a view illustrating how a pattern is connected in the prior art.

FIG. 2 is a fundamental block diagram showing an FIB (focused ion beam) apparatus used in an embodiment of the invention. An ion beam 1 emitted from a liquid metal ion source 100 is focused on a sample 200 through the effect of a condenser lens 101 and an objective lens 106. Between these lenses are located an aperture 102, an aligner/stigmator 103, a blanker 104, and a deflector 105. The sample 200 is fixed on a stage 111 which is allowed to move in the X-axis and Y-axis directions.

A gas supplied from a gas source 110 is guided closer to a portion where an FIB bombards the sample via a gas nozzle 103. The bombardment of the FIB allows secondary electrons to be ejected from the sample. A secondary electron detector 107 serves to detect these secondary electrons and supply the detecting result as an intensity signal that is delivered to a CRT display 400 for displaying an SIM image on a screen. The CRT display 400 is designed to be scanned synchronously to the deflection of the ion beam 1.

A three-axis (X-, Y-, and Z-axes) manipulator 109 serves to convey a new device part to be transplanted into a desired place on the sample. The ion beam deflection, the signal detection, the manipulator, the stage, and the gas are all designed to be controlled by a computer 500 through a system bus.

Figure 1A:
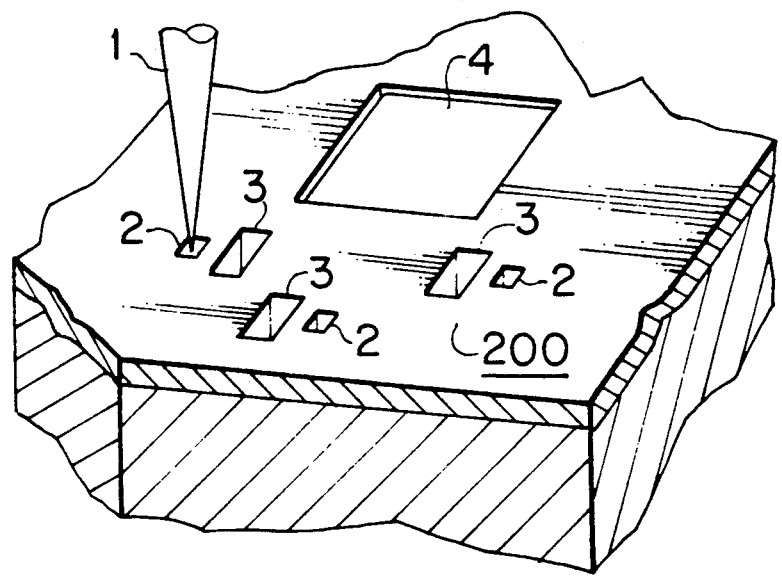
FIGS. 1A to 1F are views for describing one embodiment of the invention.
Figure 1B:
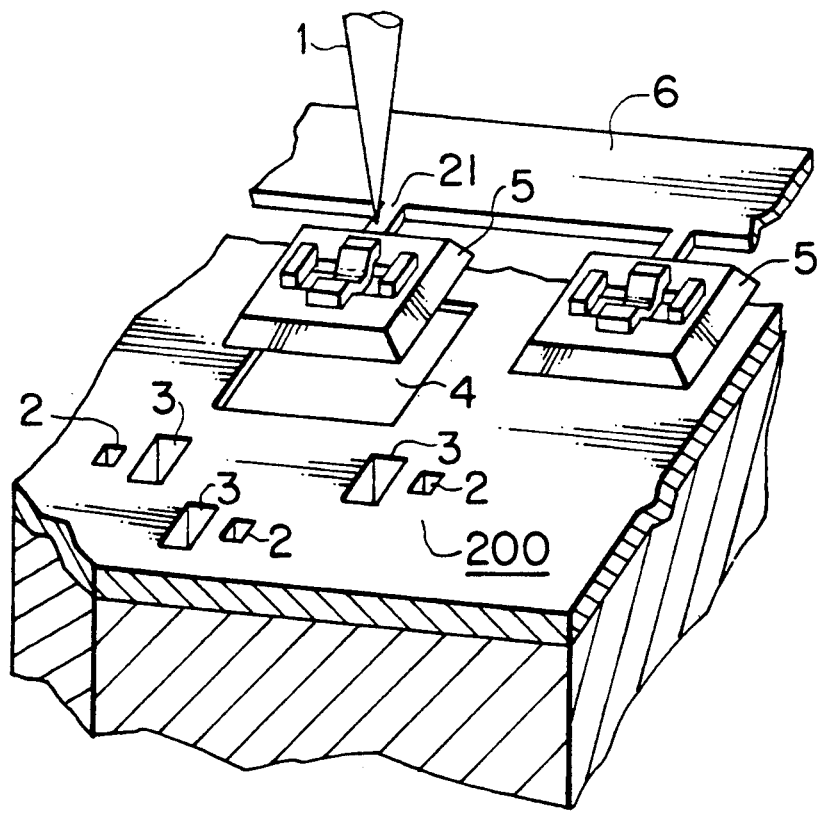
Figure 1C:
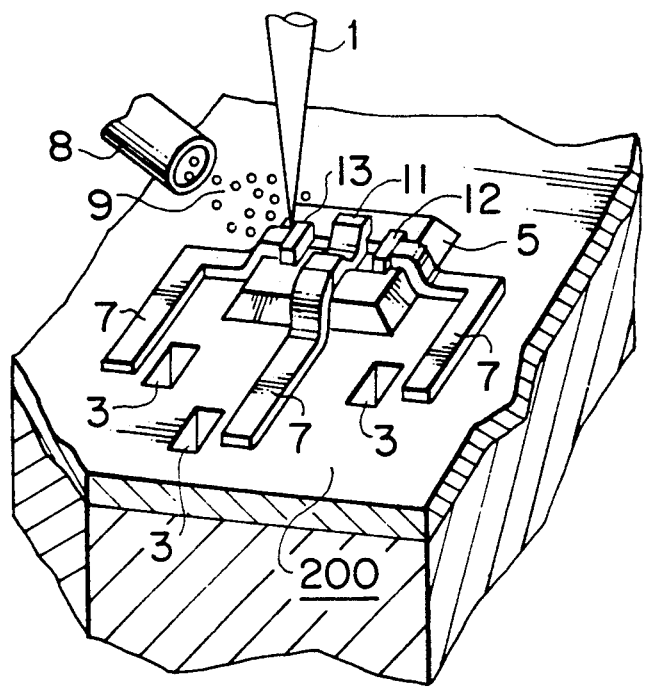
Figure 1D:
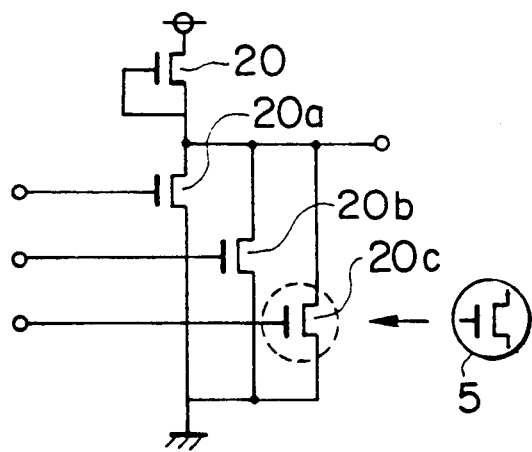

FIGS. 1A to 1F most obviously illustrate how to transplant a device according to an embodiment of the invention. The new device part to be transplanted is a field-effect transistor (hereinafter, abbreviated as an FET). FIG. 1D shows an example of a circuit arrangement of a sample that may be incorporated in a device part. This device consists of a three-input NOR circuit composed of four FETs 20, 20a, 20b, and 20c. Assuming that the FET 20c is proven to be defective as a testing result of the device, it is usually necessary to electrically disconnect the FET 20c and transplant a good part 5 in place of the FET 20c. This process will be described below.

Figure 1E:
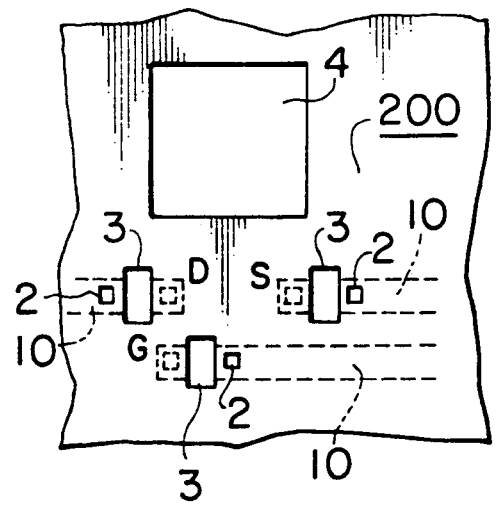
Figure 1F:
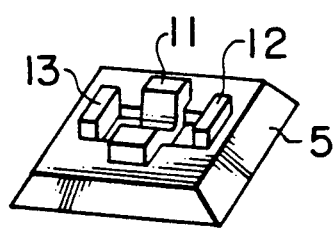

FIG. 1A shows how the bombardment of the sample 200 by the FIB 1 brings about a sputtering work. The top of the sample 200 is shown in FIG. 1E. At first, the sputtering work resulting from the bombardment by the FIB 1 provides a trimming hole 3 for trimming the wiring pattern 10 from the FET 20c. That is, this sputtering work means that the FIB 1 is operated as a through-hole miller to create a through-hole that passes through an insulated layer coated on the sample and the wiring pattern 10. Then, a contact hole 2 is formed in a manner to keep electrical connection between the wiring pattern 10 and the new device to be transplanted 5.

The formation of the hole 2 is a result of doing the sputtering work against only an insulated layer coated on the sample. To suppress the positional slippage of the new device 5, it is necessary to form a guide depression 4 on the sample 200. This formation is a result of doing the sputtering work against the insulating film coated on the sample to a shallow point.

FIG. 1B shows how to convey the new device 5 over the guide depression 4. The new device 5 is an FET element having the structure shown in FIG. 1F. On the top of the FET element are formed a gate electrode 11, a source electrode 12, and a drain electrode 13. This device 5 has a diffusion layer and electrodes on the substrate formed using a normal process. The outside of a separating layer adjacent to another element is sloped, and the rear surface of the substrate is etched. The slopes thus formed around the new device 5 are effective to prevent the wire patterns from being cut by the steps.

The new device 5 is fixed on a device frame carrier 6 through a slender arm 21. This frame 6 is held by the three-axis manipulator 109 shown in FIG. 2. The manipulator 109 and the stage 11 are thus driven to convey the new device 5 over a desired place (a guide depression 4). After conveying it, the FIB 1 bombards the arm 21 in a manner to allow the new device 5 to be separated from the frame carrier 6 and then laid in the guide depression 4.

FIG. 1C shows how the bombardment by the FIB 1 results in the formation of a conductive deposition film 7 that is matched to an electrode in a metal-containing gas 9, which is guided from a tip 8 of the gas nozzle 108. That is, the conductive deposition film 7 is connected to the electrodes 11, 12, 13 and comes into contact with each wiring pattern 10 through a contact hole 2 so that the new device 5 is electrically connected to the wiring pattern 10.

After the device transplantation, it is necessary to make sure that the element is duly operational, and to repair it again if it is not. As an example, the process of bombarding an electrode with a charge beam, analyzing the energy of secondary electrons ejected from the beam-bombarded location, and measuring a voltage of the electrode (that is, a logic level), may be employed. Then, the overall process of repairing the defective FET 20c is finished, if the element tests operational.

According to the foregoing embodiment, the new device to be transplanted is mounted on the sample surface, resulting in the reduction of a step different to some degree. If the bombardment by the FIB 1 makes it possible to do the sputtering work for removing a defective device, the new device is transplanted into a depression formed after the defective device is removed, thereby reducing the step difference on the sample surface.

Providing that a large integrated circuit is formed on a wafer-scale large area circuit of a gallium-arsenic substrate, it is unlikely that no defect is brought about on the large-scale integrated circuit. For duly operating the circuit, it is therefore necessary to repair defects after the circuit is manufactured. If no defects are found other than wiring defects, it is possible to repair them using the prior art device, which merely disconnects and connects wiring patterns.

However, it is likely that defects will occur in active elements formed inside a substrate. To avoid the defects as much as possible, redundant circuits have been utilized because redundancy makes it possible to leave the defective parts intact while connecting only the operational parts for obtaining reliable system operation. This redundancy, however, gives rise to a disadvantage in that the integration of a circuit is limited, the wiring patterns are made longer and the operating speed is made slower.

As has been described in the foregoing embodiment, the present invention is capable of transplanting a microminiature active element, thereby doing away with any requirement for redundancy in the circuit. It is therefore possible to easily realize a large-scale, highly integrated, and rapid device circuit.

Figure 6:
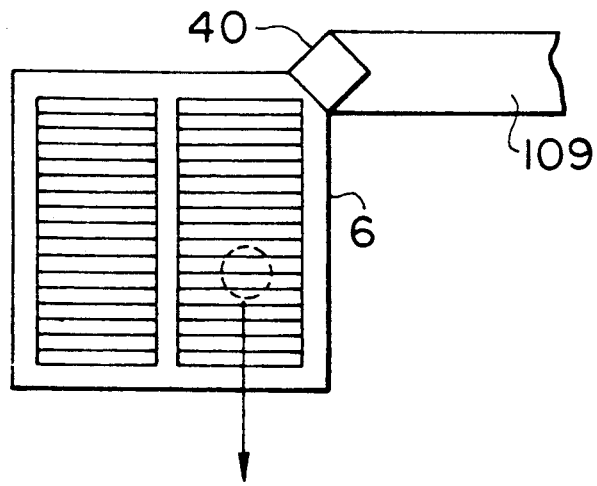
FIG. 6 is a top view showing a carrier frame on which a transplanted device is mounted and a connecting portion between the carrier frame and a manipulator.

FIG. 6 shows the overall device carrier frame 6 and a connecting portion between the device carrier frame 6 and the manipulator 109. The process of conveying each new device to be transplanted to a desired place located on the sample 200, as an example, may employ the steps of providing a pair of tweezers at the tip of the manipulator 109, grasping the new device to be transplanted one-by-one using the tweezers, moving the manipulator 109 to the desired place, and then releasing the new device from the tweezers. It is difficult to produce tweezers suitable for grasping and moving the microminiature device. Even if they are produced, these microminiature tweezers may make the overall conveying device complicated.

With a carrier frame 6, on the other hand, a large chuck 40 can be formed for connecting the frame 6 and the manipulator 109, however microminiature the device is. The simple construction thus makes it possible to convey the microminiature device. And, when the manipulator 109 is driven by an actuator comprising piezoelectric elements, the positioning of the devices is made possible at a submicron level.

Figure 7:
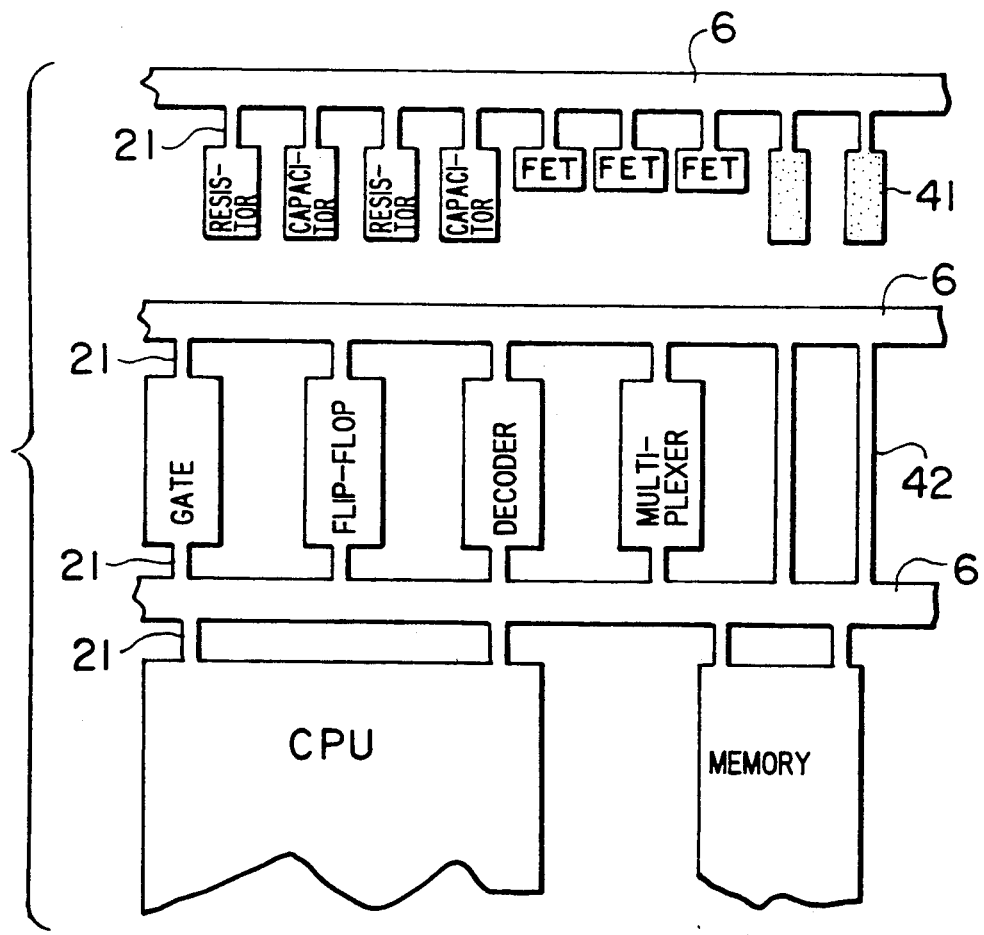
FIG. 7 is an expanded view showing the carrier frame.

FIG. 7 shows a part of the device carrier frame 6. The carrier frame 6 holds passive parts such as a resistor, a capacitor, an insulating film 41, and a conductive pattern 42 as well as an FET, a gate, a flip-flop, a decoder, a multiplexer, a CPU, and a memory through a slender arm 21. These parts may then be selected as required.

Figure 8A:
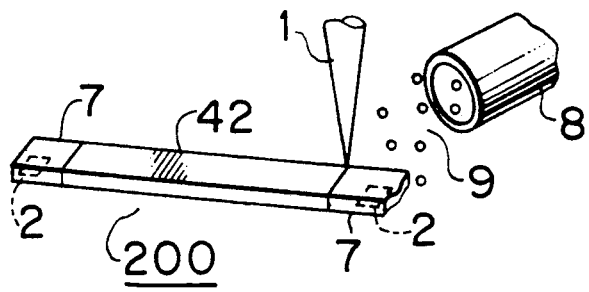
FIGS. 8A and 8B are views showing a method of modifying a wiring pattern according to the invention.
Figure 8B:
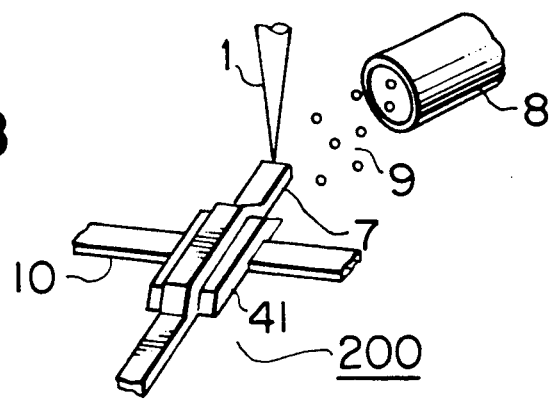

FIGS. 8A to 8B show a method of modifying a wiring pattern according to the invention. FIG. 8A shows conductive wiring patterns 42, 7 formed between contact holes 2, which are kept at a relatively long interval. The conductive wiring pattern 42 to be transplanted occupies the majority of the wiring pattern. The conductive films 7 occupy both end portions of the wiring pattern, i.e., the portions adjacent to the contact holes 2. These conductive films are deposited by bombarding with a focused ion beam in the gas atmosphere.

The conductive pattern 42 to be transplanted can be designed to have a low resistance, because it may be manufactured by the known art (sputtering technique or vacuum deposition technique) in another place. Though the conductive deposition films 7 take much time to fabricate and are designed to have high resistivity, they merely occupy quite small portions of the wiring pattern. The method of the invention is, thus, characterized by connecting the contact holes 2 at low resistance, and rapidly.

In conjunction with the annealing technique of bombarding the conductive deposition films 7 with a laser beam to lower electric resistance, the wiring pattern can be formed to have a lower resistance. FIG. 8B illustrates the crossed conductive patterns wherein the insulating film 41 to be transplanted is coated on the conductive pattern 10 and the conductive film 7 is formed on the insulating film 41. As such, the method of the invention can offer an advantage over the prior art in the formation of wiring.

Figure 9A:
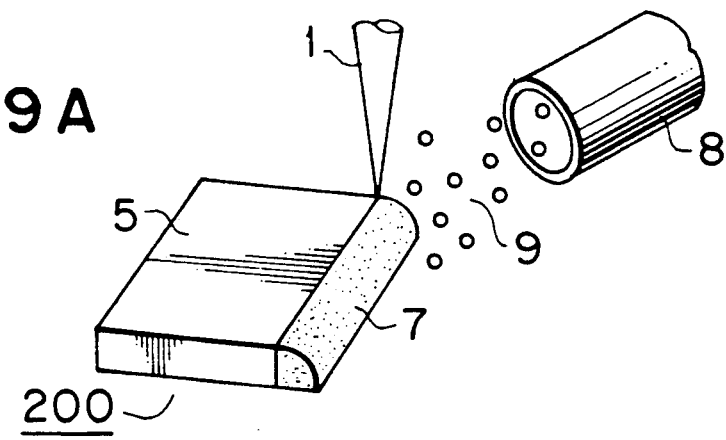
FIGS. 9A and 9B are perspective views illustrating how a transplanted device is mechanically fixed according to an embodiment of the invention.
Figure 9B:
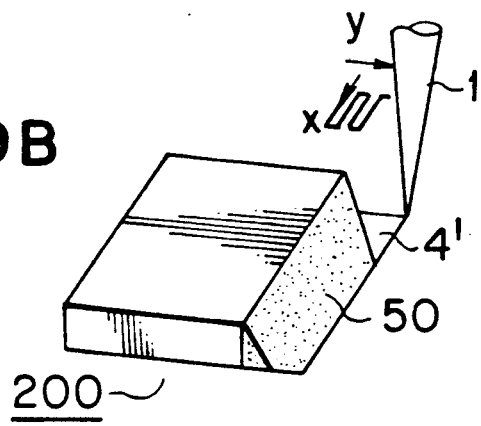

FIGS. 9A to 9B show a method for mechanically fixing a conveyed new device 5 on the sample 200. FIG. 9A shows how to mechanically connect the sample 200 to the device 5 with a conductive deposition film 7 formed by bombarding with the FIB 1 in the gas atmosphere 9. FIG. 9B shows the mechanical connection between the device 5 and the sample 200 with a re-deposition film 50 consisting of sample materials. The materials are scattered from the sputtered portion 4' formed by bombarding the surface of the sample 200 with the FIB 1. The FIB 1 is swept at a slow speed sufficient to depress the sample by a depth corresponding to the beam diameter. The traveling direction of the sweep raster (y-direction) is assumed as the direction of release from the side wall of the device 5, resulting in the efficient formation of the re-deposition film 50.

FIG. 10 shows the sample substrate 200 on which devices 5 and 5a to 5e (which may be, for example, monolithic integrated circuits) are transplanted. Sample substrate 200 simply represents a substrate or a substrate containing wire patterns and elements. Each device is powered from the lower layer along the wire pattern 7 leading through the contact hole 2. The mutual signal wire pattern 7' connecting the devices is formed on a substrate surface. After transplanting those devices, a protective film may be coated on the surface for enhancing reliance of the device.

As has been understood from this embodiment, the present invention provides on any place (which is not limited to the semiconductor substrate) a method for forming microminiature hybrid ICs consisting of monolithic ICs connected to each other. With the carrier frame on which various kinds of devices may be transplanted, the system arrangement can be flexibly realized at any place where the devices are transplanted. Further, for realizing a more flexible system arrangement, it may be possible to employ a device whose function and physical properties can be reset at each bombardment by the ion beam. This type of device is a read-only memory being programmable at each bombardment of the ion beam, or a transistor whose threshold voltage can be set by the ion implantation.

Further, although FIG. 10 shows a one-layered hybrid integrated circuit, in principle, the new devices to be transplanted can be piled on the substrate in multilayered fashion, thereby enhancing the mounting density.

FIGS. 11A to 11C show an embodiment where a microminiature diffraction grating 55 is transplanted on a substrate. As shown in FIG. 11A, the microminiature diffraction grating 55, which was premanufactured elsewhere, is retained on the frame carrier 6 through a slender arm 21. The frame carrier 6 is conveyed to a desired place on the substrate 200 by the manipulator.

As shown in FIG. 11B, the frame carrier 6 is rotated 90° to locate the microminiature diffraction grating 55 vertically to the surface of the substrate 200. Next, as shown in FIG. 11C, the FIB 1 bombards the surface in the gas atmosphere 9, and the diffraction grating 55 is fixed on the substrate 200 with a deposition film 7.

According to the invention, it is possible to keep a desired angle against the substrate when a device is transplanted on the substrate. To change the desired location for the device on the substrate, or the orientation relative to the substrate, it is necessary to form a deposition film between the arm 21 of the frame carrier 6 and the device to be transplanted, to mechanically connect both again, and to remove the deposition film 7 formed between the substrate and the new device by bombarding with the FIB (that is, by performing the sputtering operation). With the removal of the deposition film, the manipulator can move the new device so that the device can be reorientated at a new place on the substrate.

As will be understood from the foregoing embodiment, the microminiature device can be transplanted on the sample at any place and at any orientation. For example, it is possible to transplant a sensor element, for sensing a physical quantity such as an electrical signal, on the tip of a measuring probe or near a measuring point on the sample. It is thereby expected that improved measuring accuracy of a physical quantity and sensitivity of the sample will be achieved.

The foregoing embodiment has described the transplantation of the electronic and optical device parts. The present invention is, however, effective in assembling miniature machine parts. Hereinafter, a description will be directed to such an embodiment.

FIGS. 12A to 12F are views showing the manufacturing process of a micro mechanism. A microminiature gear 60 is fitted to a microminiature shaft formed on the sample 200 and a cap 61 of the gear 60 for preventing slipping off from the shaft is fitted to the shaft 65. The gear 60 is rotated on the shaft 65. The manufacturing process will be described step by step.

Figure 12A:
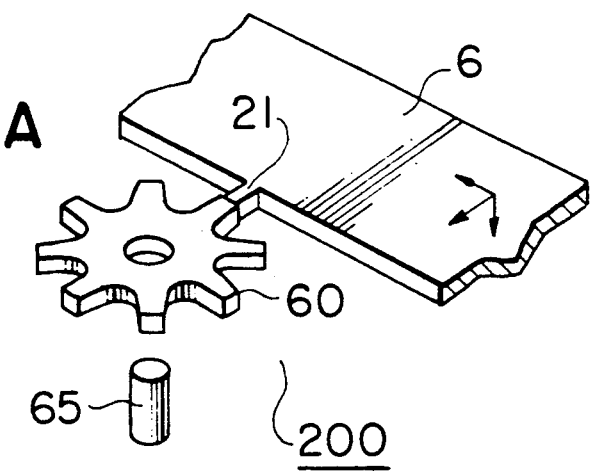
FIGS. 12A to 12F are explanatory views illustrating how a microminiature gear mechanism is implemented according to an embodiment of the invention.

As shown in FIG. 12A, and with additional reference to the basic staging elements shown in FIG. 2, a stage 111 is moved so that a portion made on the shaft 65 can be moved closer to an optical axis of the FIB 1. The gear 60 to be transplanted is retained on the carrier frame 6 and the gear 60 is conveyed over the shaft 65. As shown, the gear 60 is fixed on the device carrier frame 6 through the arm 21 so that it is allowed to be moved in any direction by the three-axis manipulator 109. The manipulator 109 can be controlled so that the gear 60 is fitted to the shaft 65.

Figure 12B:
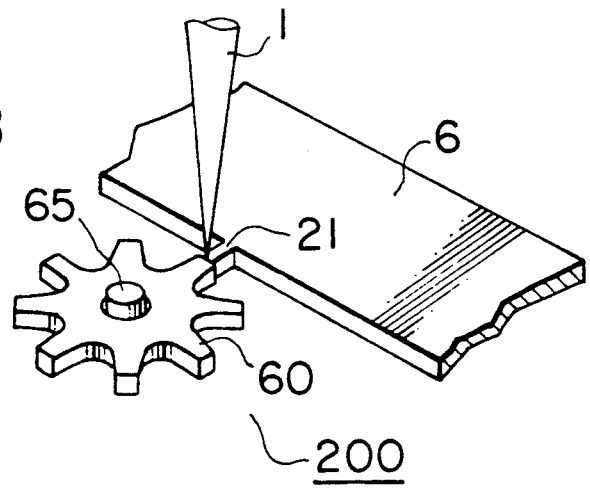
Figure 12C:
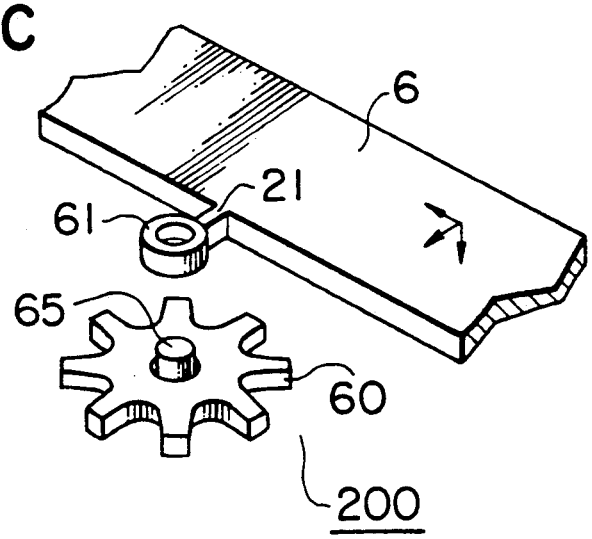

As shown in FIG. 12B, the FIB 1 bombards the arm 21 to cut the arm 21. This results in releasing the gear 60 from the frame 6 and rotatably inserting the gear to the shaft 65. Then, as shown in FIG. 12C, the manipulator 109 is driven so that the cap 61 retained on the frame 6 is conveyed over the shaft 65. The cap 61 is fitted into the shaft 65 in the same manner.

Figure 12D:
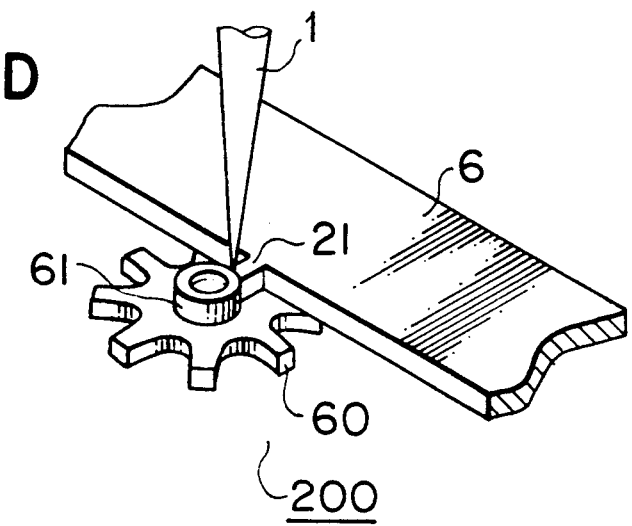
Figure 12E:
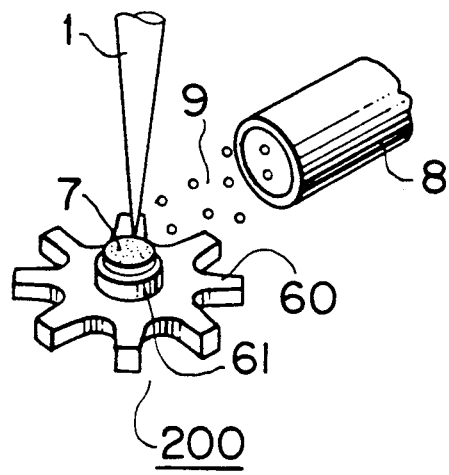

Next, as shown in FIG. 12D, the FIB 1 bombards the arm 21 to cut it as before, thus releasing the cap 61 from the frame 6 and fitting the cap 61 to the top end of the shaft 65. Finally, as shown in FIG. 12E, the FIB 1 bombards the top portion of the cap 61 in the gas atmosphere 9 to form the deposition film 7, thereby mechanically connecting the shaft 65 to the cap 61.

Figure 12F:
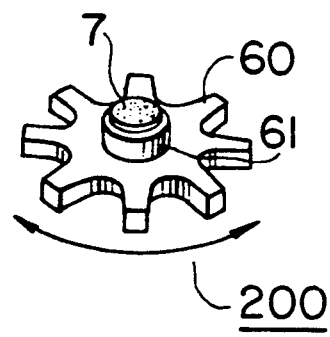

In accordance with the foregoing process, it is possible to realize a microminiature gear mechanism to be rotated on the shaft 65, as shown in FIG. 12F. In the present embodiment, the use of the FIB 1 is limited to cutting the arm 21 and forming the deposition film 7. Yet, as a rule, it may be used for forming an ion-implanting layer in a microminiature area so that the mechanical properties (hardness, friction coefficients, etc.) of the gear friction portion can be improved. In this instance, the type of ion, the accelerating energy, and the ion-implantation amount have to be optimized.

FIGS. 13A to 13D show an embodiment where the method for device transplantation is used for manufacturing miniature forceps to be driven by a piezoelectric device.

Figure 13A:
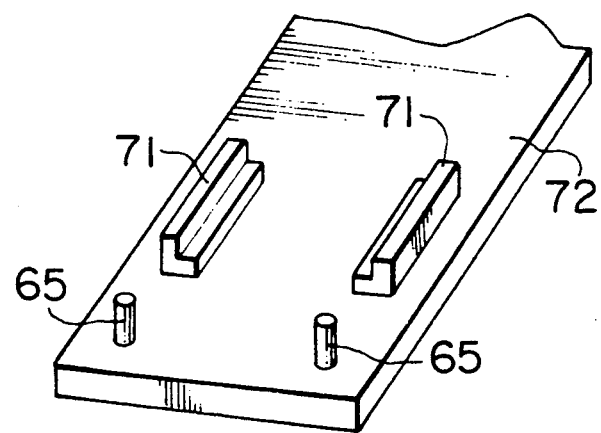
FIGS. 13A to 13D are explanatory views illustrating how a pair of microminiature forceps are manufactured according to an embodiment of the invention.
Figure 13B:
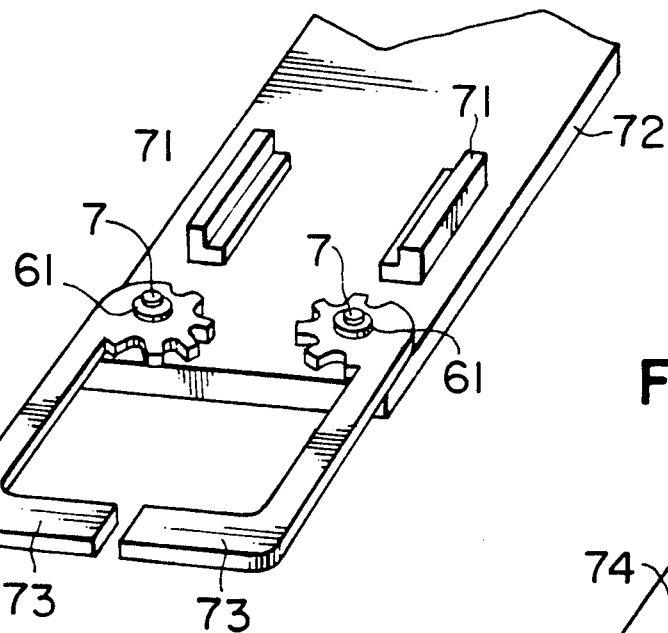

As shown in FIG. 13A, a shaft 65 and a guide 71 are produced on a platform 72 using photo lithography and sputter deposition techniques. As shown further in FIG. 13B, the rotary arm 73 is fitted to the shaft 65 in the same process as the foregoing gear mechanism.

Figure 13C:
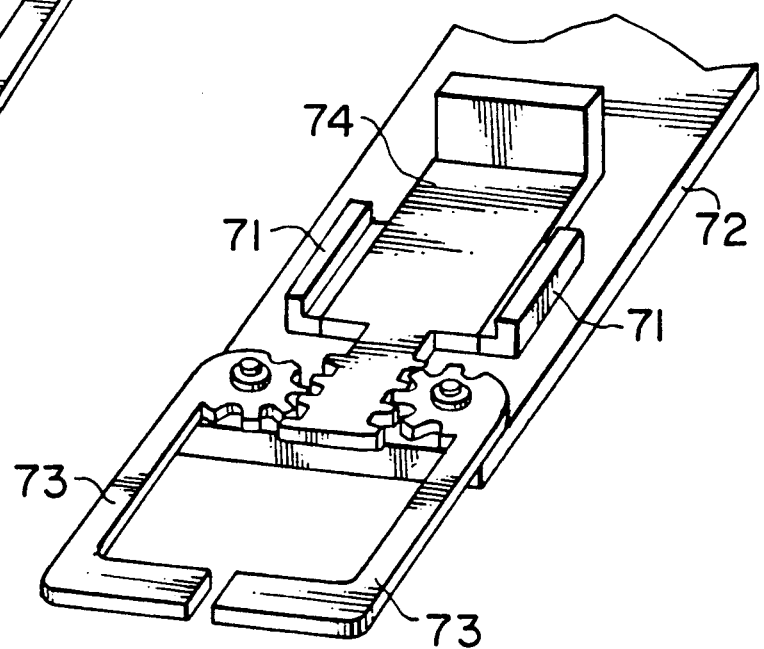
Figure 13D:
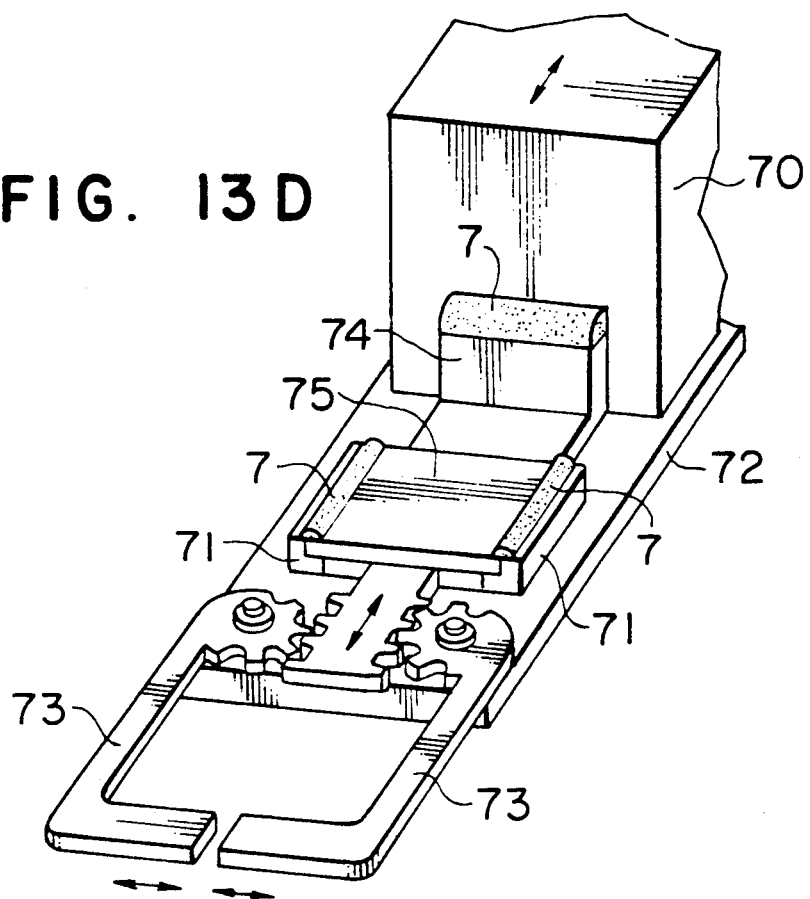

Next, as shown in FIG. 13C, a slider 74 is mounted between guides 71. At the final stage, as shown in FIG. 13D, a presser plate 75 is laid on a step portion of one guide 71 and is secured thereby a deposition film 7. The slider 74 is likewise connected to a piezoelectric element actuator 70 through another deposition film 7.

The piezoelectric element actuator 70 is powered so that it can be expanded or shrunk while maintaining an interlocking relationship with the slider 74, the gear mechanism serving to move the rotary arms 73. The forceps are capable of pinching or releasing a microminiature device so that they can be provided at the tip of the manipulator 109 in a manner to allow the microminiature device to be freely conveyed.

The foregoing description has been directed to an embodiment where microminiature machine parts are assembled. The method for device transplantation may also apply to the assemblage of electrode elements, such as components of a microminiature vacuum tube or a microminiature charged particle optical system, for example.

Figure 14:
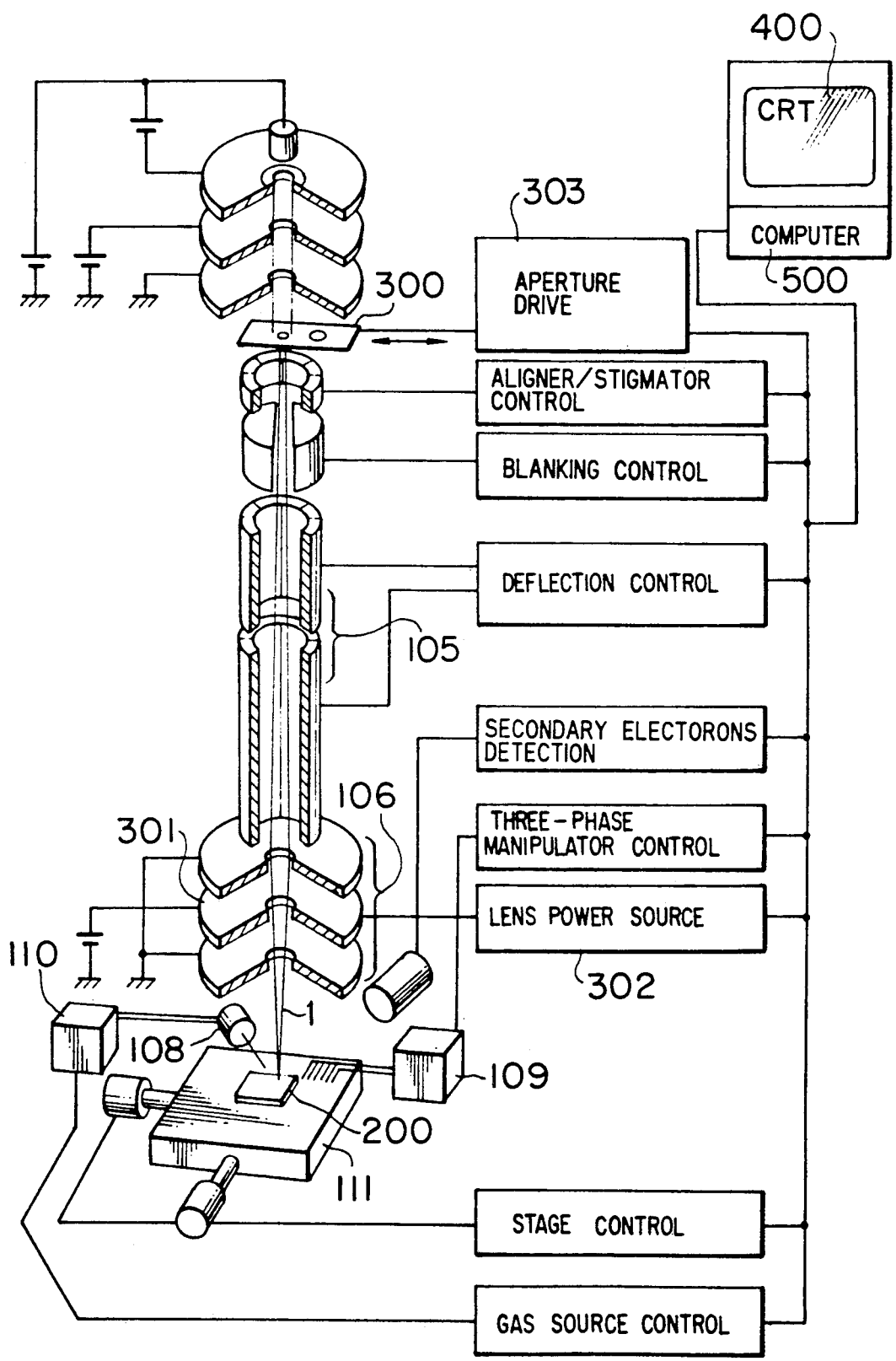
FIG. 14 is a block diagram showing a system comprising the FIB system shown in FIG. 2 with added functions.

FIG. 14 is a schematic diagram showing the FIB apparatus provided with a variable aperture 300, which is preferably computer-controlled, and a lens power source 302. The variable aperture 300 is varied by an aperture driving system 303 and the lens power source 302 serves to vary a lens voltage supplied to the lens electrode 301.

As the variable aperture 300 increases in diameter, the beam diameter is made larger. Hence, fabrication on a microminiature level becomes increasingly difficult. However, since the resulting beam current is increased, rapid fabrication can be realized.

On the other hand, as the variable aperture 300 reduces in diameter, the beam diameter is made smaller. Hence, fabrication on a microminiature level becomes easier. However, since the resulting beam current is reduced, the working speed slows down.

In the embodiment shown in FIG. 1, therefore, when precise fabrication is required, for example, in the case of forming a contact hole, it is preferred to use a smaller-diameter aperture. When precise fabrication is not so required, for example, in case of cutting a manipulator arm, it is preferred to use a larger-diameter aperture. Consequently, the overall working time can be reduced, resulting in improved throughput.

Like the ion-driving optical system described in this embodiment, the pre-lens deflection system serves to reduce the distance (referred to as a working distance) between the objective lens 106 and the sample 200, thereby enabling the formation of a high current density beam. Since the depth of focus is relatively small, the lens power source 302 provides each voltage value according to the height of each sample to be focused.

In light of this phenomenon, the focus voltage supplied from the lens power source 302 can be used for deriving a distance between the sample surface and the device to be transplanted while it is being conveyed by the manipulator 109. This effect makes it unnecessary to provide a high-precision dimension-measuring means along a Z-axis direction (height) of the manipulator 109. In addition, for positioning the device in the X-Y direction, two methods may be employed for providing a high-precision dimension-measuring means at the manipulator 109, and for deriving the position of the new device from the SIM image and feeding it back to the driving system of the manipulator 109.

The foregoing embodiment has employed an ion beam as a focusing beam. The same effect can be realized by an electronic beam or a laser beam as well.

If an electronic beam is used for observing the position and the form of a sample and a moving device, it causes less radiation damage than does the ion beam previously described. In addition, if an electronic beam is used for fabrication, it is necessary to use an etching gas such as chlorine gas in sputtering, and a metal gas such as hexacarbonyl tungsten in depositing a film.

If the laser beam is used for fabrication, it provides a lower focusing characteristic than the ion beam and the electronic beam. Since, however, it can realize transplantation in the air, the transplantation to an organic body is made possible. In observing the position and the for of a sample and a new device, an optical microscope can be used.

The present invention enables high-quality device manufactured in advance to be transplanted anywhere on the sample, whether the new device to be transplanted is a passive element, an active element, a microminiature mechanical part, or the like.

The present invention makes it possible to manufacture any device having a composition and structure such as a MOS, a bipolar element, a GaAs device, a superconductive device, or an amorphous device, along with corresponding functional materials, in accordance with the optimized process, and to mount those devices in a hybrid integrated manner to comprise a system. For example, the system may be arranged to comprise a magnetic sensor (SQUID), an analog section, and a digital section, and the steps of sensing a magnetic signal in the SQUID, amplifying the sensed signal, analog-to-digital converting it into a digital signal in the analog section, and processing the digitized signal in the digital section.

Figure 15:
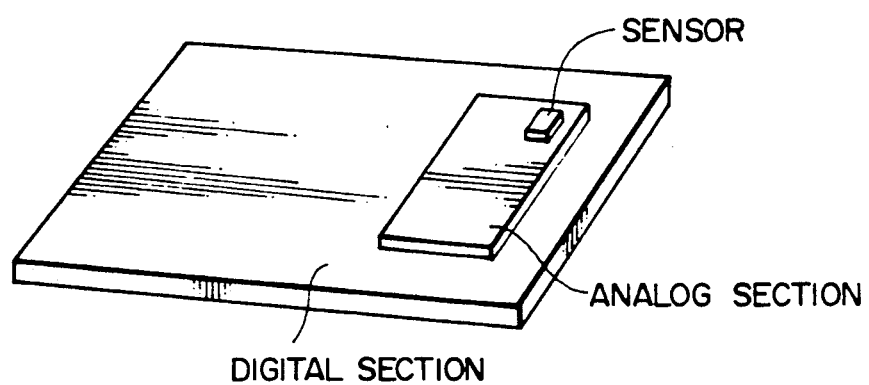
FIG. 15 is a view illustrating a hybrid integrated circuit comprising a different material according to an embodiment of the invention.

FIG. 15 shows an embodiment in which a sensor section and a signal processing system are integrated at a super high density. The sensor section consists of a SQUID (magnetic sensor) employing a superconductive material, the analog section consists of an amplifier employing a bipolar element and an analog-to-digital converter, and the digital section consists of a signal processor (operator) employing a C-MOS element. The sensor section is arranged to have high sensitivity, since it employs a superconductive element. The analog section can implement the analog-to-digital conversion at high speed without high noise since it employs a bipolar element. The system can be arranged to consume low power and enhance the integration density since the digital section employs the C-MOS element.

For an embodiment wherein different kinds of materials are transplanted for systemization, an Si MOS device is transplanted as a peripheral circuit of a thin-film transistor (TFT) circuit formed on a glass substrate. The TFT is inferior in performance and integration to the MOS element formed on the Si substrate. To overcome the inferiority, the peripheral circuit is composed of a monocrystalline Si-system device, resulting in improvement of the performance of the overall system.

As has been obvious from the foregoing embodiments, the present invention makes it possible to assemble any type of device, even if each device has the corresponding manufacturing process and composition, thereby being able to manufacture a new function element.

What is claimed is:

1. A method for transplanting a device for mounting on a substrate, comprising the steps of:

transplanting a first device to a predetermined position on a substrate, said first device having at least one circuit element function; and forming a wiring layer for electrically connecting said first device to a circuit element located on said substrate, said wiring layer being formed by bombarding with a first focused beam, while supplying a gas containing a metal element, in the vicinity of a position at which said wiring layer is to be formed.

2. A method for transplanting a device as claimed in claim 1, further comprising the steps of:

detecting a defective circuit element among a plurality of circuit elements formed on the substrate; and separating said defective circuit element from electrical communication with the other circuit elements by bombarding a predetermined location of said substrate with a second focused beam;

wherein said first device is transplanted to a first position on said substrate.

3. A method for transplanting a device according to claim 2, further comprising the step of:

positioning said first device above said first position of said substrate by holding said first device with a manipulator and by moving said manipulator and said substrate relative to each other.

4. A method for transplanting a device as claimed in claim 27, wherein said first device is transplanted by a manipulator relative to said substrate, said manipulator including a frame carrier to which said first device to be transplanted is fixed through an arm;

said transplanting step is carried out by separating said first device to be transplanted from said frame carrier by bombarding said arm with a third focused beam; and said forming step is further carried out sufficiently to electrically connect a signal terminal of said first device to a position of a wiring pattern formed between the other circuit element.

5. A method for transplanting a device as claimed in claim 1, further comprising the steps of:

disposing a second device to be transplanted at a different predetermined position on the substrate from that of the first device; and forming a wiring pattern layer for electrically connecting a signal terminal of said first device to a signal terminal of said second device, said wiring pattern layer being formed by bombarding with a second focused beam, while supplying a gas containing a metal element, in the vicinity of a position at which said wiring pattern layer is to be formed.

6. A method for transplanting a device as claimed in claim 1, wherein said forming step is carried out to electrically connect a plurality of said first devices to each other.

7. A method for transplanting a device as claimed in claim 1, wherein said focused beam is an ion beam.

8. A method for transplanting a device as claimed in claim 1, wherein said focused beam is an electronic beam.

9. A method for transplanting a device as claimed in claim 1, wherein said focused beam is a laser beam.

10. A method for transplanting a device as claimed in claim 2, wherein said first device has a like electrical function as said defective circuit element.

11. A method for transplanting a device for mounting on an integrated circuit substrate, comprising the steps of:

disposing a wiring pattern member between first and second contact holes in an integrated circuit substrate, to electrically connect the first and second contact holes to each other;

forming a first wiring pattern layer for electrically connecting said first contact hole to a first region of said wiring pattern member by bombarding with a first focused beam, while supplying a gas containing a metal element, in the vicinity of said first region of said wiring pattern member; and forming a second wiring pattern layer for electrically connecting said second contact hole to a second region of said wiring pattern member by bombarding with a second focused beam, while supplying a gas containing a metal element, in the vicinity of said second region of said wiring pattern member.

12. A method for transplanting a device as claimed in claim 11, wherein said focused beam is an ion beam.

13. A method for transplanting a device as claimed in claim 11, wherein said focused beam is an electronic beam.

14. A method for transplanting a device as claimed in claim 11, wherein said focused beam is a laser beam.

15. A method for transplanting a device for mounting on a substrate, comprising the steps of:
disposing at least one device to be transplanted at a predetermined position on a substrate; and
forming a deposition film for securing said device to said substrate, said deposition film being formed by bombarding with a first focused beam, while supplying a gas containing a metal element to be contained in said deposition film, in the vicinity of a location at which said deposition film is to be formed.

16. A method for transplanting a device according to claim 15, wherein said device is an electrical insulating member, and said deposition film is a wiring layer.

17. A method for transplanting a device according to claim 15, wherein said bombardment is carried out in the vicinity of an outer peripheral surface of said device.

18. A method for transplanting a device according to claim 17, wherein said step of disposing is carried out by moving a manipulator and said substrate relative to each other, said manipulator holding a frame carrier to which said device is mounted through an arm; and further comprising the step of:
separating said device from said frame carrier by bombarding said arm with a second focused beam.

19. A method for transplanting a device as claimed in claim 15, wherein said step of disposing at least one device to be transplanted is carried out by moving a manipulator and said substrate relative to each other, said manipulator holding a frame carrier to which said device is fixed through an arm; and further comprising the step of:
separating said device to be transplanted from said frame carrier by bombarding said arm with a second focused beam.

20. A method for transplanting a device as claimed in claim 15, wherein said focused beam is an ion beam.

21. A method for transplanting a device as claimed in claim 15, wherein said focused beam is an electronic beam.

22. A method for transplanting a device as claimed in claim 15, wherein said focused beam is a laser beam.

23. A method for transplanting a device for mounting on a substrate, comprising the steps of:
forming a shaft on a substrate;
providing a manipulator holding a frame carrier;
positioning a device to be transplanted above a location at which the shaft is formed on the substrate, said device being a rotary member having an aperture into which the shaft is fitted, by moving the manipulator and said substrate relative to each other, each frame carrier mounting said rotary member through a first arm;
fitting said shaft to said rotary member by separating said rotary member from said frame carrier by bombarding said arm with a first focused beam;
positioning a cap above said shaft by moving said manipulator and said substrate relative to each other, said cap being mounted to said frame carrier through a second arm;
fitting said cap about said shaft;
separating said cap from said frame carrier by bombarding said second arm with a focused beam; and
forming a deposition film for securing said cap to said shaft by bombarding with a second focused beam, while supplying a gas containing an element to be contained in said deposition film, in the vicinity of a position at which said deposition film is to be formed.

24. A method for transplanting a device according to claim 23, further comprising the step of:
transforming a physical property of said rotary member by bombarding said rotary member with a third focused beam.

25. A method for transplanting a device as claimed in claim 23, further comprising the steps of:
preparing said substrate to include first and second guides in order to form forceps with said shaft and said rotary arm;
disposing a slider between said first and second guides, said slider having a gear tooth train which engages a gear tooth train of said rotary arm;
disposing a presser plate for preventing said slider from slipping across said first and second guides;
forming a deposition film for securing said presser plate to said first and second guides, said deposition film being formed by bombarding with a fourth focused beam, while supplying a gas containing an element to be contained in said deposition film, in the vicinity of an end surface of said presser plate;
disposing a piezoelectric element actuator for rotating said rotary arm on said substrate so that an end surface of said piezoelectric element actuator is in contact with an end surface of said slider; and
forming a deposition film for securing the end surface of said piezoelectric element actuator to the end surface of said slider, said deposition film being formed by bombarding with a fifth focused beam, while supplying a gas containing an element to be contained in said deposition film, in the vicinity of the end surface of said slider.

* * * * *